United States Patent [19]

Fende

[11] Patent Number: 4,583,057
[45] Date of Patent: Apr. 15, 1986

[54] MICROWAVE OSCILLATOR

[75] Inventor: John R. Fende, Mason, Ohio

[73] Assignee: Cincinnati Microwave, Inc., Cincinnati, Ohio

[21] Appl. No.: 656,023

[22] Filed: Sep. 28, 1984

[51] Int. Cl.⁴ ............................................. H01P 7/06
[52] U.S. Cl. .............................. 331/107 DP; 331/96; 333/227; 333/232
[58] Field of Search ............. 331/96, 107 DP, 177 V; 333/227, 232; 343/5 DD

[56] References Cited

FOREIGN PATENT DOCUMENTS 3145386  5/1983  Fed. Rep. of Germany ...... 331/107 DP

OTHER PUBLICATIONS

Reference Data for Radio Engineers—p. 23-19.
Foundations for Microwave Engineering, pp. 322-323.
"Proven Procedures Guide Cavity VCO Design" *Microwave* (May, 1981).
Microwave Engineer's Handbook, p. 26.
Foundations for Microwave Engineering, p. 96.

Primary Examiner—Eugene R. LaRoche
Assistant Examiner—Robert J. Pascal
Attorney, Agent, or Firm—Wood, Herron & Evans

[57] ABSTRACT

A box-shaped metal microwave oscillator is provided having two pairs of substantially parallel, confronting inner surfaces, the second pair perpendicular to the first pair to define an oscillator cavity. The forward end of the cavity is walled off with a slotted wall to permit only a portion of the oscillator energy to be emitted. The spacing of certain of the walls and the location of the oscillator components to the wall is described.

62 Claims, 3 Drawing Figures

MICROWAVE OSCILLATOR

This invention relates to microwave oscillators, and more particularly to microwave oscillators for use in police radar warning receivers.

A police radar warning receiver is an electronic assembly mountable in a vehicle, such as a passenger car or truck, motorcycle, boat or the like, which travels on land or water in areas subject to speed-monitoring radar surveillance by police, and functions to detect the presence of the police radar and provide the driver or user with an audible and/or visual indication that his speed is being checked by radar.

Typically, a police radar warning receiver includes an antenna, a printed circuit board, the circuitry needed to determine whether the received signal is a police radar signal and to provide appropriate indications and alarms, and a power regulator device which regulates the energy received from a vehicle battery to power the circuitry. These components are located within a box-like housing having four side walls and front and rear end panels. The front panel which, when the receiver is mounted in the vehicle, faces the user, has indicators and control knobs. The rear wall has extending from it a power cord terminating in an appropriately configured plug to be received into the vehicle cigarette lighter.

Police radar units operate in either the X-band or the K-band of the frequency spectrum, as discussed in U.S. Pat. No. 4,313,216. Typical radar warning receivers are adapted to detect police radar signals in either band. Accordingly, police radar warning receivers are sometimes referred to as dual frequency radar warning receivers.

One illustrative form of prior art receiver is the ESCORT radar warning receiver currently marketed by the assignee herein, Cincinnati Microwave Inc. of Cincinnati, Ohio. The ESCORT radar warning receiver contains circuitry permitting it to detect and indicate the presence of both X-band and K-band police radar signals. That circuitry is disclosed in aforesaid U.S. Pat. No. 4,313,216. Briefly, the oscillator generates dual frequency signals which are quasi-harmonically related. These signals mix with the incoming signal and provide an output or mixed signal (the IF). The IF signal is evaluated to determine whether a police radar signal is present in which case an alarm is activated. This process is referred to as heterodyning, or super-heterodyning where the IF is mixed again with another local oscillator signal before evaluation.

Improved versions of the circuitry disclosed in U.S. Pat. No. 4,313,216 are described in U.S. patent application Ser. No. 575,422, filed Jan. 31, 1984, and U.S. patent application Ser. No. 656,026 entitled "Police Radar Warning Receiver With Mute Function," invented by Richard L. Grimsley, and filed concurrently herewith. Both of the aforesaid patent applications are also assigned to Cincinnati Microwave, Inc.

Police radar warning receivers of the heterodyne or super-heterodyne type utilize a microwave oscillator. Accordingly, an object of the present invention has been to provide an improved microwave oscillator for use in a police radar warning receiver.

That objective has been achieved by providing a box-shaped oscillator section having a first pair of substantially parallel, confronting inner surfaces and a second pair of substantially parallel, confronting inner surfaces, the latter being perpendicular to the former to define an oscillator cavity. The oscillator also has a slotted wall perpendicular to the four inner surfaces and positioned at one end of the oscillator section to preferentially permit only a portion of the oscillator generated microwave signals to pass out of the oscillator cavity, whereby oscillation can be maintained in the oscillator cavity.

The oscillator further includes a Gunn diode having a central axis and being mounted within the oscillator cavity. The Gunn diode central axis is equidistant from both the second pair of inner surfaces and is spaced rearwardly of the slotted wall a predetermined distance L. The second pair of inner surfaces are spaced apart a predetermined distance W as determined by the formula:

$$f_o = C\left[\sqrt{\frac{W^2 + L^2}{2WL}}\right]$$

wherein
C = velocity of light;
L > W; and
12.0 Ghz < $f_o$ < 12.5 Ghz.

In a preferred embodiment, L is 0.755 inches and W is 0.627 inches.

The oscillator also includes a dielectric tuning rod having a central axis and being selectively projectable into the oscillator. The central axis of the rod is spaced rearwardly of the slotted wall a predetermined distance $T_1$ and a predetermined distance $T_2$ away from a selected one of the second pair of inner surfaces wherein:
0.420 inches < $T_1$ < 0.480 inches;
W/2 − 0.030 inches < $T_2$ < W/2 + 0.030 inches.

In the preferred embodiment, $T_1$ is 0.450 inches and $T_2$ is approximately equal to W/2. Also, the rod is preferably comprised of alumina.

The slotted wall preferably includes an iris having a predetermined width WI and a predetermined height HI, the iris being centered in the slotted wall. In order to sweep the oscillator as required for a radar warning receiver, the oscillator further comprises a varactor diode having a central axis and being mounted within the oscillator cavity. The central axis of the varactor diode is spaced rearwardly a predetermined distance $V_1$ from the slotted wall and spaced from a selected one of the second pair of inner surfaces of a predetermined distance $V_2$ as determined by the equation:

$$K = \sin^2\left(\frac{V_1\pi}{L}\right)\sin^2\left(\frac{V_2\pi}{W}\right)$$

wherein
0.11 < K < 0.27;
$V_1$ < $T_1$; and $$V_2 < \left(\frac{W}{2} - \frac{WI}{2}\right).$$

In the preferred embodiment, $V_1$ is 0.240 inches and $V_2$ is 0.103 inches.

The objective and features of the present invention will become more readily apparent from the following detailed description taken with the accompanying drawings wherein like reference numerals apply to like structure and in which.

GENERAL DESCRIPTION OF THE MICROWAVE OSCILLATOR

Figure 1:
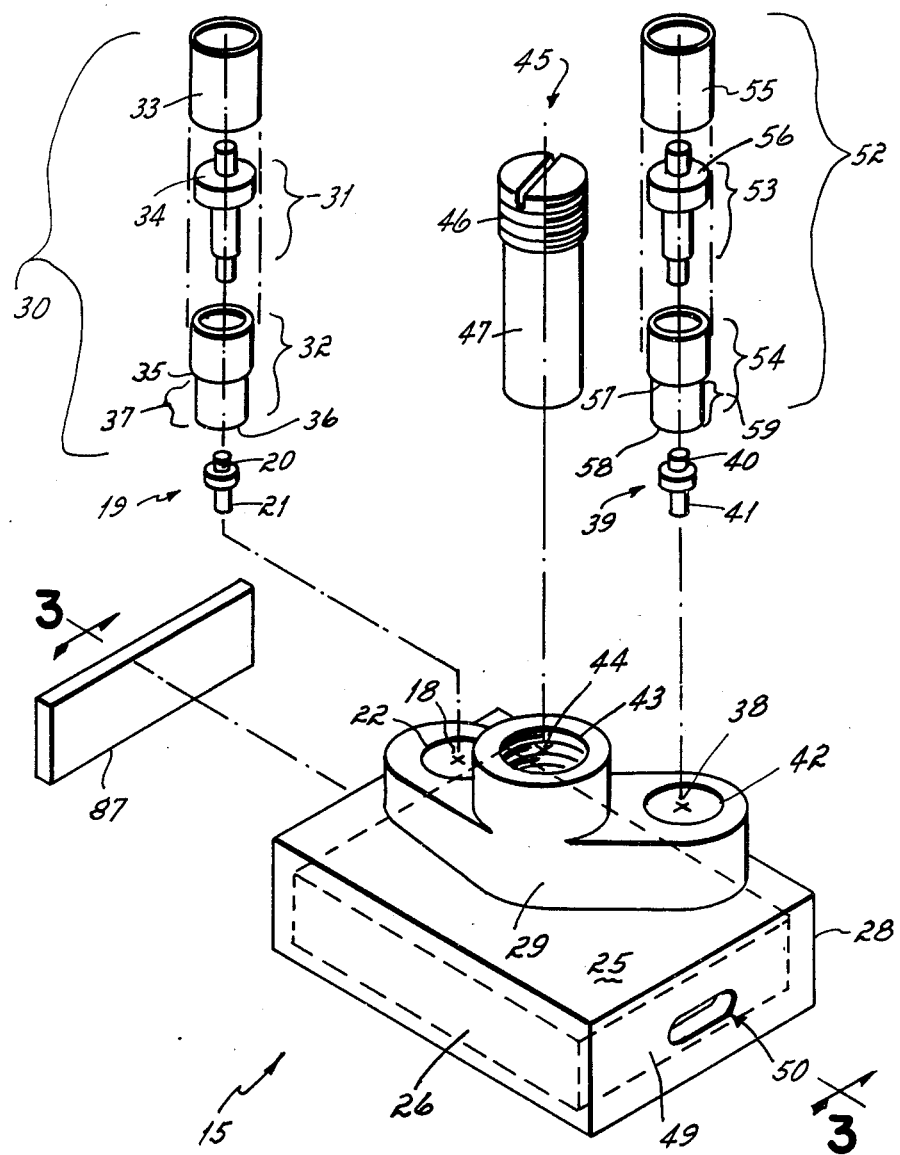
FIG. 1 is an exploded, isometric view of a preferred embodiment of a microwave oscillator of the present invention.
Figure 2:
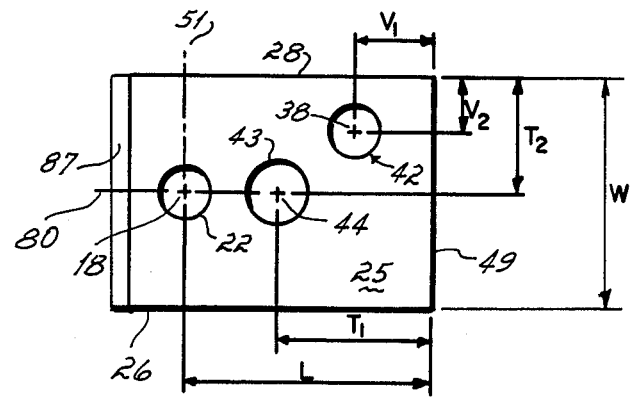
FIG. 2 is a top plane view of the microwave oscillator of FIG. 1.

With reference to FIG. 1, there is disclosed a microwave oscillator 15.

Microwave oscillator 15 is particularly adapted to operate according to aforesaid U.S. Pat. No. 4,313,216 and U.S. application Ser. No. 575,422, filed Jan. 31, 1984, assigned to the assignee herein. The disclosures thereof are incorporated herein by reference.

Oscillator 15 is a box-shaped aluminum casting with integral mounting wall 29 formed in top wall 25.

A variety of oscillator components are mounted to, or through, top wall 25. It is to be understood herein that when the term "mounted to" is used, it is meant to connote that the item is either physically in contact therewith or that by cooperation with other parts which do make physical contact therewith, the item is inserted therethrough and held in place by those other parts. Thus, Gunn diode 19 which is within oscillator cavity 48 is mounted to top wall 25 inasmuch as diode 19 is insertable through hole 22 and is held in place by a variety of parts, as will be discussed, which do contact mounting wall 29 which is integral to and thus part of the exterior of top wall 25. Mounted on wall 29 is circuit board 100 to which is mounted most of the associated circuitry (not shown) to operate oscillator 15. Board 100 would preferably also have mounted to it the associated circuitry necessary to operate a police radar warning receiver (not shown).

DETAILED DESCRIPTION OF THE MICROWAVE OSCILLATOR

Oscillator section 15 has at least four walls, top wall 25, a left wall 26, a bottom wall 27 and a right wall 28 which cooperate to define the oscillator cavity 48 referred to above.

The inner surfaces of walls 25–28 of oscillator 15 must diverge from each other to permit the casting core to be easily pulled from the oscillator section, resulting, for example, in thicker bottom walls near wall 49 than spaced away from wall 49. Thus, bottom wall 27 is 0.098 inches thick at wall 49 and 0.085 inches thick at the rearward end at wall 87.

Another result of the draft caused during casting is that walls whose inner surfaces are preferably parallel will diverge slightly. Accordingly, as used herein, the term substantially parallel indicates that parallelism is satisfied where, but for the minor divergence induced by draft, the surfaces or planes would be parallel. For example, the inner surfaces of walls 25 and 27 are preferably parallel and spaced apart 0.195 inches. However, due to draft, they are spaced apart 0.185 inches adjacent wall 49 and 0.210 inches adjacent wall 87.

Oscillator 15 has a box-shaped cavity 48 defined by the substantially smooth, flat inner cavity-facing surfaces of walls 25, 26, 27 and 28. As mentioned, the inner surfaces of spaced apart walls 25 and 27 are substantially parallel. Similarly, the inner surfaces of spaced apart walls 26 and 28 are substantially parallel to one another but are substantially perpendicular to the inner surfaces of walls 25 and 27. Oscillator 15 also includes forward slotted wall 49. Forward wall 49 substantially closes off cavity 48 thereby keeping sufficient energy within cavity 48 to sustain oscillations. Wall 49 is also provided with a horizontally centered and oval-shaped iris 50 to permit some of the oscillator energy to escape for purposes such as mixing or heterodyning, as discussed in aforesaid U.S. Pat. No. 4,313,216.

Top wall 25 is provided with an integral mounting wall 29 through which are mounted the oscillator components: gallium arsenide Gunn diode 19; gallium arsenide varactor diode 39, folded chokes 30, 52 and tuning rod 45.

Each of the chokes 30, 52 have diode mounts 36, 58 at their lower extremities in which are inserted anode 20 and cathode 40 of diodes 19 and 39, respectively. Cathode 21 and anode 41 of diodes 19 and 39 are received in mounting depressions 73 and 74, respectively, formed in bottom wall 27. The barrels 37, 59 of chokes 30, 52, respectively, are within cavity 48 and are 0.125 inches in diameter.

To mount the diodes and chokes, diode 19 and choke 30 are inserted through mounting hole 22 and diode 39 and choke 52 are inserted through mounting hole 42. A printed circuit board 100 is secured over mounting wall 29. Downward pressure from cantilevered arms 101 and 103 hold chokes 30 and 52 against diodes 19 and 39 thereby keeping the diodes mounted securely to top wall 25. The formation of cantilevered arms 101 and 103 in board 100 is discussed in concurrently filed U.S. patent application Ser. No. 656,026, entitled "Police Radar Warning Receiver", invented by John R. Fende, Gregory R. Furnish, and Richard L. Grimsley, and assigned to Cincinnati Microwave, Inc. The disclosure of that application is incorporated herein by reference.

Figure 3:
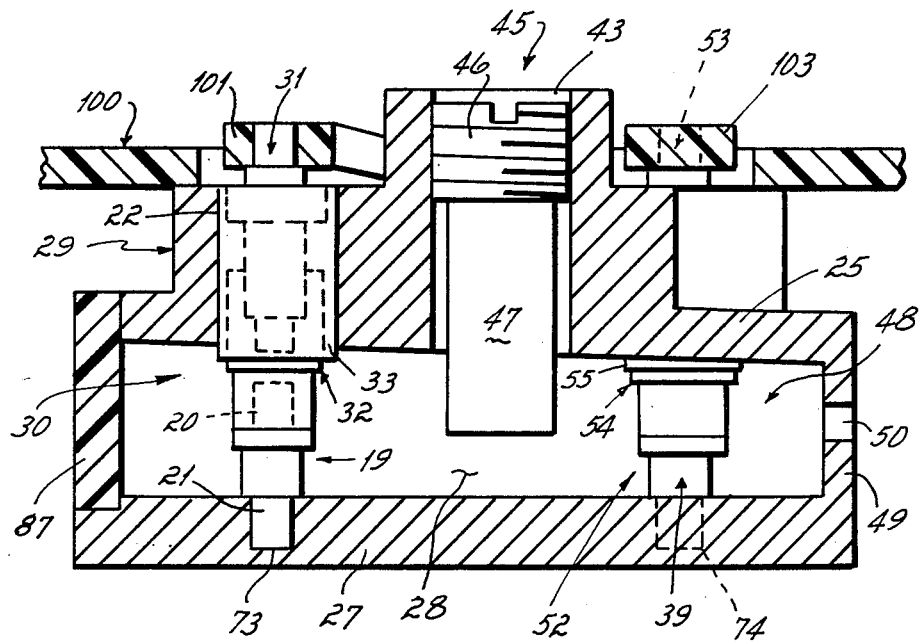
FIG. 3 is a non-exploded, cross-sectional view of the microwave oscillator of FIG. 1, taken along line 3—3 of FIG. 1 and including a printed circuit board.

Diodes 19 and 39 are "post coupled." Folded chokes 30, 52 provide a DC short circuit and an AC inductive coupling between the anode 20 and cathode 40 of their respective mating diodes 19, 39 and the associated operating circuitry (not shown) of a receiver (not shown). Chokes 30, 52 also capacitively couple the anode 20 and cathode 40 to the walls of oscillator 15. To insulate them from DC electrical contact with the oscillator walls and to hold their respective silver-plated hard brass components (31, 32 and 53, 54) together, chokes 30 and 52 are provided with heat-shrinkable sleeves 33 and 55, respectively. As shown in FIG. 3, the sleeves are heat shrunk around chokes 30, 52 to conform to their shape. The sleeves extend from above the shoulder 34, 56 of top pieces 31, 53 to just below the ledge 35, 57 of bottom pieces 32, 54, respectively.

Tuning rod 45, which has a threaded brass top 46 and a cylindrical alumina body 47 is received through threaded mounting hole 43 and can be adjusted to project into cavity 48 the desired distance to tune oscillator 15.

An important advantage of this invention is that improved operating characteristics are obtained by placing the oscillator components in specific relationship to each other and to the walls of oscillator 15.

To precisely identify the location of the oscillator components reference is had to the central or vertical axis 18 of diode 19, central axis 38 of diode 39, and central axis 44 of tuning rod 45.

Electrically, cavity 48 includes the volume between slotted wall 49 and a parallel plane 51 which intersects central axis 18, between the inner surfaces of walls 26 and 28, and between the inner surfaces of walls 25 and 27. Central axis 18 is equidistant from the inner surface of both walls 26 and 28 and thus lies along the longitudinal axis 80 of oscillator 15. The distance L from wall 49 to central axis 18 is determined in relation to the distance W between inner surfaces of walls 26 and 28 by the formula:

$$f_o = C \left[ \sqrt{\frac{W^2 + L^2}{2WL}} \right]$$

wherein $L > W$; $C$ = velocity of light, 0.705 inches $> L <$ 0.805 inches and 12.0 GHz $< f_o <$ 12.5 GHz. In the preferred embodiment, L is 0.755 inches and W is 0.627 inches. As discussed earlier with respect to the draft due to casting the oscillator 15, distance W actually varies from 0.614 inches adjacent front wall 49 to 0.640 inches behind plane 51. Thus, the value of 0.627 inches for W is an average value but it should be understood that use of that number comprehends the variation over the length L which is due to the draft in casting oscillator 15.

Cemented to the rear end of oscillator 15 is preferably a ferrite wall 87. Wall 87 is spaced rearwardly from diode 19 0.200 inches. Indeed, wall 87 could be eliminated although it improves oscillator 15 by suppressing certain undesirable signals such as the 17 GHz mode.

The location of varactor diode 39 and tuner 45, central axes 38 and 44, respectively, are to be determined in relation to L and W.

As previously mentioned, $f_o$ is in the range of 12-12.5 GHz which is somewhat above the nominal local oscillator frequency of 11.55 GHz as discussed in U.S. Pat. No. 4,313,216, which has been incorporated herein by reference. However, the specific dimensional relationships discussed above are selected to permit diode 19 to oscillate prior to tuning at a frequency above the desired local oscillator (LO) frequency so as to maintain desirable temperature characteristics, power output, tuning range, and sweep range necessary to proper operation of a radar warning receiver, yet not so far above the desired LO frequency that it is not within a range in which tuning rod 45 can cause oscillations to be tuned to the LO frequency.

Accordingly, central axis 44 is spaced rearwardly of wall 49 a distance $T_1$, which must be greater than L/2 and is preferably 0.450 inches plus or minus 0.030 inches. Central axis 44 is also spaced to the left of the inner surface of wall 28 a predetermined distance which is approximately W/2 plus or minus 0.030 inches. Tuner 45 can be slightly offset from the center of longitudinal axis of oscillator 15 and it is believed that that offset may even enhance the operation and tunability of the oscillator.

Central axis 38 of varactor diode 39 is spaced a distance $V_1$ from slotted wall 49 and a distance $V_2$ from the interior of right wall 28. Distances $V_1$ and $V_2$ are determined by the formula:

$$K = \sin^2\left(\frac{V_1 \pi}{L}\right) \sin^2\left(\frac{V_2 \pi}{W}\right)$$

K is preferably held to a range between 0.11 and 0.27. As K increases, the sweep range of the oscillator may increase to an unacceptably large range whereas as K decreases, the sweep range may not be large enough. Accordingly, it has been determined that the range of 0.11 to 0.27 would produce a good cavity 48 within which to maintain appropriate oscillations over the appropriate sweep range. Additionally, $V_1$ must be less than $T_1$, is preferably < 0.38 inches, and is, more preferably, 0.240 inches.

$V_2$ must be a value which will preclude placing varactor diode 39 near or on the longitudinal axis 80 of oscillator 15 so as not to be placed between the energy path from Gunn diode 19 to and through iris 50 in slotted wall 49. Iris 50 is centered horizontally in slotted wall 49, has a height of 0.040 inches and a width of 0.218 inches. In view of the location and width of iris 50, $V_2 \leq$ 0.154 inches and is preferably 0.103 inches. $V_1$ and $V_2$ also have practical lower limits due to the diameter of varactor diode 39 as well as the diameter of choke 52 as is well understood.

In operation, when electrical potential is applied to choke 30, Gunn diode 19 will tend to oscillate somewhere in the 12 to 12.5 GHz range. By adjusting tuning rod 45 into or out of cavity 48, the actual frequency of oscillation within oscillator cavity 48 can be adjusted to a range appropriate for operation as discussed in U.S. Pat. No. 4,313,216. To affect sweeping to operate the receiver as is further discussed in U.S. Pat. No. 4,313,216, varying electrical potential is provided to varactor diode 39 through choke 52. As a result, the capacitive effect of diode 39 will vary thereby changing the frequency of oscillations within cavity 48.

Disclosed in concurrently filed U.S. patent application Ser. No 656,026, entitled "Polic Radar Warning Receiver," invented by John R. Fende, Gregory R. Furnish, and Richard L. Grimsley, assigned to Cincinnati Microwave Inc., is a police radar warning receiver adapted to utilize the oscillator of the present invention. The disclosure of that application has been incorporated herein by reference.

Having described the invention, what is claimed is:

1. A microwave oscillator comprising:

an electrically conductive structure having a first pair of substantially parallel, confronting, spaced apart walls and a second pair of substantially parallel, confronting, spaced apart walls, said second pair of walls being substantially perpendicular to said first pair of walls to define an oscillator cavity, each said wall having an inner, cavity-facing surface;

tunable oscillator means mounted to a selected one of said walls and projecting into said oscillator cavity and cooperating with said cavity to generate an oscillator signal having a frequency of approximately 11.55 GHz when said tunable oscillator means is tuned;

end wall means substantially perpendicular to said first and second pair of wall inner surfaces and disposed at one end of said structure for preferentially permitting only a portion of said oscillator signal to pass out of said oscillator cavity whereby oscillation can be maintained in said oscillator cavity;

said tunable oscillator means including a first semiconductor device mounted within said oscillator cavity, said first semiconductor device having a central axis equidistant from both said inner surfaces of said second pair of oscillator walls and spaced from said end wall means a predetermined distance L; and said inner surface of said second pair of oscillator walls being spaced apart a predetermined distance W as determined by the formula:

$$f_o = C\left[\sqrt{\frac{W^2 + L^2}{2WL}}\right]$$

wherein

C = velocity of light;

L > W; and $f_o$ is in the approximate range of twelve GHz to twelve and a half GHz.

2. The oscillator of claim 1 wherein L is in the approximate range of seven-tenth inch to eight-tenth inch.

3. The oscillator of claim 1 wherein L is approximately three-quarter inch.

4. The oscillator of claim 1 wherein W is in the approximate range of 0.61 inch to 0.64 inch.

5. The oscillator of claim 1 wherein W is approximately five-eighth inch.

6. The oscillator of claim 1, said oscillator means further including tuning means selectively projectable into said oscillator cavity for tuning said microwave oscillator, said tuning means having a central axis spaced (a) from said end wall means a predetermined distance $T_1$ and (b) a predetermined distance $T_2$ away from a selected one of said inner surfaces of said second pair of oscillator section walls wherein $T_1$ is in the approximate range of L/2 inch to L inch and $T_2$ is approximately W/2 inch.

7. The oscillator of claim 6 wherein L is in the approximate range of seven-tenth inch to eight-tenth inch.

8. The oscillator of claim 7 wherein $T_1$ is in the approximate range of four-tenth inch to one-half inch.

9. The oscillator of claim 6 wherein $T_1$ is in the approximate range of four-tenth inch to one-half inch.

10. The oscillator of claim 6, wherein said tuning means includes a rod-shaped member.

11. The oscillator of claim 10 wherein said rod-shaped member is comprised of alumina.

12. The antenna of claim 6 wherein said end wall means includes an iris having a predetermined width WI and a predetermined height HI, said iris being centered horizontally in said end wall means;

said oscillator means further comprising a second semiconductor device mounted within said oscillator cavity, said second semiconductor device having a central axis spaced a predetermined distance $V_1$ from said end wall means and spaced from a selected one of said inner surfaces of said second pair of oscillator section walls a predetermined distance $V_2$ as determined by the equation $$K = \sin^2\left(\frac{V_1 \pi}{L}\right) \sin^2\left(\frac{V_2 \pi}{W}\right)$$

wherein 0.11 < K < 0.27;

$V_1 < T_1$; and $$V_2 < \left(\frac{W}{2} - \frac{WI}{2}\right).$$

13. The oscillator of claim 12 wherein L is in the approximate range of seven-tenth inch to eight-tenth inch.

14. The oscillator of claim 13 wherein $T_1$ is in the approximate range of four-tenth inch to one-half inch.

15. The oscillator of claim 14 wherein $V_1$ is less than approximately four-tenth inch.

16. The oscillator of claim 14 wherein $V_1$ is approximately one-quarter inch.

17. The oscillator of claim 16 wherein L is approximately three-quarter inch.

18. The oscillator of claim 3 wherein W is approximately five-eighth inch.

19. The oscillator of claim 10 wherein said rod-shaped member is threadably received in said wall.

20. The oscillator of claim 9 wherein L is approximately three-quarter inch.

21. The oscillator of claim 9 wherein W is in the approximate range of 0.61 inch to 0.64 inch.

22. The oscillator of claim 9 wherein W is approximately five-eighth inch.

23. The oscillator of claim 20 wherein W is in the approximate range of 0.61 inch to 0.64 inch.

24. The oscillator of claim 20 wherein W is approximately five-eighth inch.

25. The oscillator of claim 17 wherein W is in the approximate range of 0.61 inch to 0.64 inch.

26. The oscillator of claim 17 wherein W is approximately five-eighth inch.

27. The oscillator of claim 14 wherein $V_2$ is no greater than approximately 0.15 inch.

28. The oscillator of claim 14 wherein $V_2$ is approximately one-tenth inch.

29. The oscillator of claim 28 wherein L is approximately three-quarter inch.

30. The oscillator of claim 29 wherein W is in the approximate range of 0.61 inch to 0.64 inch.

31. The oscillator of claim 29 wherein W is approximately five-eighth inch.

32. The oscillator of claim 31 wherein $V_1$ is approximately one-quarter inch.

33. The oscillator of claim 1 wherein said first semiconductor device is a Gunn diode.

34. The oscillator of claim 1, said structure being a unitary, integral metal structure.

35. The oscillator of claim 1, said wall inner surfaces being substantially smooth and flat.

36. The oscillator of claim 1, said end wall means being electrically slotted.

37. The oscillator of claim 6 wherein said first semiconductor device is a Gunn diode.

38. The oscillator of claim 6, said structure being a unitary, integral metal structure.

39. The oscillator of claim 6, said wall inner surfaces being substantially smooth and flat.

40. The oscillator of claim 6, said end wall means being electrically slotted.

41. The oscillator of claim 12, said first semiconductor device being a Gunn diode.

42. The oscillator of claim 12, said second semiconductor device being a varactor diode.

43. The oscillator of claim 12, said structure being a unitary, integral metal structure.

44. The oscillator of claim 12, said wall inner surfaces being substantially smooth and flat.

45. The oscillator of claim 12, said end wall means being electrically slotted.

46. A microwave oscillator comprising:
an electrically conductive structure having a first pair of substantially parallel, confronting, spaced apart walls and a second pair of substantially parallel, confronting, spaced apart walls, said second pair of walls being substantially perpendicular to said first pair of walls to define an oscillator cavity, each said wall having an inner, cavity-facing surface;
tunable oscillator means mounted to a selected one of said walls and projecting into said oscillator cavity and cooperating with said cavity to generate an oscillator signal having a frequency of approximately 11.55 GHz when said tunable oscillator means is tuned;
end wall means substantially perpendicular to said first and second pair of wall inner surfaces and disposed at one end of said structure for preferentially permitting only a portion of said oscillator signal to pass out of said oscillator cavity whereby oscillation can be maintained in said oscillator cavity;
said tunable oscillator means including a first semiconductor device mounted within said oscillator cavity, said first semiconductor device having a central axis equidistant from both said inner surfaces of said second pair of oscillator walls and spaced from said end wall means a predetermined distance L; and
said inner surface of said second pair of oscillator walls being spaced apart a predetermined distance W as determined by the formula:

$$f_o = C\left[\sqrt{\frac{W^2 + L^2}{2WL}}\right]$$

wherein C=velocity of light; 12.0 GHz$<f_o<$12.5 GHz; and L is approximately three-quarter inch and greater than W;
said tunable oscillator means further including tuning means selectively projectable into said oscillator cavity for tuning said microwave oscillator, said tuning means having a central axis spaced (a) from said end wall means a predetermined distance $T_1$ and (b) a predetermined distance $T_2$ away from a selected one of said inner surfaces of said second pair of oscillator walls wherein $T_1$ is in the approximate range of 0.42 inch to 0.48 inch and $T_2$ is approximately W/2 inch.

47. The oscillator of claim 46 wherein W is approximately five-eighth inch.

48. The oscillator of claim 46 wherein
said end wall means includes an iris having a predetermined width WI and a predetermined height Hi, said iris being centered horizontally in said end walls means;
said oscillator means further comprising a second semiconductor device mounted within said oscillator cavity, said second semiconductor device having a central axis being spaced a predetermined distance $V_1$ from said end wall means and spaced from a selected one of said inner surfaces of said second pair of oscillator section walls a predetermined distance $V_2$ as determined by the equation $$K = \sin^2\left(\frac{V_1\pi}{L}\right)\sin^2\left(\frac{V_2\pi}{W}\right)$$

wherein
0.11$<$K$<$0.27; $V_1$ is less than approximately four-tenth inch and $V_2$ is no greater than approximately 0.15 inch.

49. The oscillator of claim 48 wherein $T_1$ is approximately 0.45 inch; $V_1$ is approximately one-quarter inch and $V_2$ is approximately one-tenth inch.

50. The oscillator of claim 46, said structure being a unitary, integral metal structure.

51. The oscillator of claim 46, said wall inner surfaces being substantially smooth and flat.

52. The oscillator of claim 46, said end wall means being electrically slotted.

53. The oscillator of claim 46, said first semiconductor device being a Gunn diode.

54. The oscillator of claim 53, said second semiconductor device being a varactor diode.

55. The oscillator of claim 46, said second semiconductor device being a varactor diode.

56. The oscillator of claim 48, said first semiconductor device beig a Gunn diode.

57. The oscillator of claim 48, said second semiconductor device being a varactor diode.

58. The oscillator of claim 48, said wall inner surfaces being substantially smooth and flat, said end wall means being electrically slotted, and said first semiconductor device being a Gunn diode.

59. The oscillator of claim 49, said wall inner surfaces being substantially smooth and flat, said end wall means being electrically slotted, and said first semiconductor device being a Gun diode.

60. The oscillator of claim 59, said second semiconductor device being a varactor diode.

61. The oscillator of claim 46, said tuning means including a rod-shaped member threadably received in said wall.

62. The oscillator of claim 46, said tuning means includes a rod-shaped member comprised of alumina.

* * * * *

UNITED STATES PATENT AND TRADEMARK OFFICE
CERTIFICATE OF CORRECTION

PATENT NO. : 4,583,057
DATED : April 15, 1986
INVENTOR(S) : John R. Fende

It is certified that error appears in the above-identified patent and that said Letters Patent is hereby corrected as shown below:

Col. 6, line 35, "Polic" should be --Police--.

Col. 10, line 5, "Hi" should be --HI--.

The formula as printed at Col. 2, lines 17-22; Col. 5, lines 11-16; Col. 7, lines 6-11; and Col. 9, lines 40-45; as:

"$f_o = C \left[ \sqrt{\frac{W^2 + L^2}{2WL}} \right]$" should be -- $f_o = C \left[ \frac{\sqrt{W^2 + L^2}}{2WL} \right]$ --.

Signed and Sealed this
Second Day of December, 1986

*Attest:*

DONALD J. QUIGG

*Attesting Officer*  *Commissioner of Patents and Trademarks*